United States Patent
Zibold et al.

(10) Patent No.: US 9,310,454 B2
(45) Date of Patent: Apr. 12, 2016

(54) DETECTION OF A DIELECTRIC OBJECT

(75) Inventors: Tobias Zibold, Stuttgart (DE); Andrej Albrecht, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 462 days.

(21) Appl. No.: 13/696,421

(22) PCT Filed: Mar. 10, 2011

(86) PCT No.: PCT/EP2011/053617
§ 371 (c)(1),
(2), (4) Date: Feb. 20, 2013

(87) PCT Pub. No.: WO2011/138081
PCT Pub. Date: Nov. 10, 2011

(65) Prior Publication Data
US 2013/0207667 A1    Aug. 15, 2013

(30) Foreign Application Priority Data
May 7, 2010  (DE) .......................... 10 2010 028 718

(51) Int. Cl.
*G01R 35/00*    (2006.01)
*H03K 17/955*   (2006.01)

(52) U.S. Cl.
CPC .............. *G01R 35/00* (2013.01); *H03K 17/955* (2013.01)

(58) Field of Classification Search
USPC .................................. 324/661, 662, 681, 686
See application file for complete search history.

(56) References Cited

U.S. PATENT DOCUMENTS

| | | | |
|---|---|---|---|
| 3,958,078 A * | 5/1976 | Fowler et al. | ................ 348/127 |
| 5,373,245 A | 12/1994 | Vranish | |
| 5,844,415 A | 12/1998 | Gershenfeld et al. | |
| 7,116,117 B2 * | 10/2006 | Nakano et al. | ................ 324/688 |
| 2003/0080755 A1 | 5/2003 | Kobayashi | |
| 2006/0250142 A1* | 11/2006 | Abe | .............................. 324/663 |
| 2009/0212849 A1 | 8/2009 | Reime | |

FOREIGN PATENT DOCUMENTS

| | | |
|---|---|---|
| CN | 85 1 08657 A | 6/1986 |
| CN | 1585904 A | 2/2005 |

(Continued)

OTHER PUBLICATIONS

International Search Report corresponding to PCT Application No. PCT/EP2011/053617, mailed Jun. 17, 2011 (German and English language document) (5 pages).

*Primary Examiner* — Alesa Allgood
(74) *Attorney, Agent, or Firm* — Maginot, Moore & Beck LLP (57) ABSTRACT

A measuring apparatus for detecting a dielectric object comprises a potential probe for determining an electric potential in an electric field, a first capacitance device, a second capacitance device, and a control device configured to supply alternating voltages to the first and the second capacitance devices. The control device is configured to amplify the alternating voltages in opposite directions to one another in order to minimize the magnitude of an AC voltage component, which is clock-synchronous with the alternating voltages, of a voltage which is recorded by means of the potential probe. The dielectric object is detected when a ratio of the alternating voltages does not correspond to a ratio of (i) a first distance of the potential probe from the first capacitance device to (ii) a second distance of the potential probe from the second capacitance device.

11 Claims, 4 Drawing Sheets

(56) References Cited

FOREIGN PATENT DOCUMENTS

| CN | 1711550 A | 12/2005 |
|---|---|---|
| DE | 40 06 119 A1 | 8/1991 |
| DE | 697 19 321 T2 | 10/2003 |
| DE | 102 52 425 A1 | 2/2004 |
| DE | 10 2007 058 088 A1 | 6/2009 |
| DE | 10 2008 005 783 A1 | 7/2009 |
| DE | 10 2008 054 445 A1 | 6/2010 |
| WO | 98/07051 A1 | 2/1998 |
| WO | 98/26506 A1 | 6/1998 |

* cited by examiner

Fig. 1

DETECTION OF A DIELECTRIC OBJECT

This application is a 35 U.S.C. §371 National Stage Application of PCT/EP2011/053617, filed on Mar. 10, 2011, which claims the benefit of priority to Serial No. DE 10 2010 028 718.0, filed on May 7, 2010 in Germany, the disclosures of which are incorporated herein by reference in their entirety.

The disclosure relates to a detector for a dielectric object. In particular, the disclosure relates to a measuring device for detecting a dielectric object.

BACKGROUND

Capacitive detectors for detecting an object concealed in a wall, such as a beam concealed in a wall, have been disclosed in the prior art. These frequently use an electrode, the charging behavior of which is observed in order to home in on the dielectric object. Detectors with a plurality of electrodes, wherein a change in the capacitance of electrode pairs is determined, have also been disclosed. It is usually necessary to calibrate these detectors manually on the wall, as the units themselves are not able to detect contact with the wall, and the capacitance depends on ambient conditions such as a dampness of the wall, a humidity or an ambient temperature. It is therefore not possible to calibrate detectors of this kind once during manufacture; instead the calibration must be carried out by a user relatively shortly before a measurement. In doing so, the result of a measurement depends on the quality of the calibration. If the detector is calibrated with wall contact at a point where a beam is located, a later measurement result can be ambiguous, which can confuse the user.

Furthermore, the detectors described are prone to tilting on the wall. As a result of tilting, the distances of a plurality of electrodes from the wall are unequal, so that measured capacitances are subject to error. In addition, the capacitance measured at the electrodes when the detectors described approach the wall does not increase steadily, so that the distance from the wall and an approach or distancing of the detector from the wall can be difficult to reproduce.

DE 10 2008 005 783 A1 describes a moisture-independent capacitive device for protecting against trapping. The trapping sensor comprises two electrodes with variable spacing. The trapping sensor and a circuit with constant capacitance are supplied with alternating voltages, wherein the voltages are amplified or attenuated so that a voltage at one of the electrodes of the trapping sensor is minimized. If the relative spacing of the electrodes is changed, then trapping is detected based on an increased voltage at the electrode.

The disclosure is based on the object of providing a simple and accurate detector for a dielectric object, e.g. a wooden beam in a wall.

SUMMARY

The disclosure achieves this object by means of a measuring device and by a method as described herein.

According to the disclosure, a measuring device for detecting a dielectric object comprises a potential probe for determining an electrical potential in an electric field, a first and a second capacitance device and a control device for supplying the first and second capacitance device with alternating voltages. The control device is designed to amplify the alternating voltages in opposite directions to one another in order to minimize the magnitude of an alternating voltage component, which is clock-synchronous with the alternating voltages, of a voltage which is recorded by means of the potential probe. The dielectric object is detected when the alternating voltages are of unequal magnitude.

The measuring device according to the disclosure determines a difference between two capacitances, so that interference effects which affect both capacitances do not affect the result of the measurement. Here, each of the capacitance devices can comprise an electrode which forms a capacitance together with an electrode of the potential probe. Calibration of the measuring device by a user can be dispensed with, and the calibration can be carried out once, for example during the manufacture of the measuring device. As calibration on the wall is unnecessary, an object can also be directly and reliably detected when the device is placed on the wall in the vicinity of the object.

Preferably, the electrodes of the first and second capacitance device are arranged substantially in one plane and the electrode of the potential probe is arranged outside this plane. The relative change in distance of the electrodes during tilting is small compared with the overall distance of the electrodes from the wall compared with an arrangement with which the transmitting electrodes rest directly on the wall. The relative change in capacitance of the capacitance devices when the measuring device is tilted with respect to the wall can be minimized, thus minimizing a measuring error.

The potential probe can comprise two receiving electrodes connected to a differential amplifier, wherein the receiving electrodes are arranged on different sides of the plane with distances, preferably equal distances, from the first and second capacitance device. The differential amplifier can additionally include a high-pass filter. As a result of the differential measurement, the signal provided by the differential amplifier is insensitive to outside influences, such as a wall connected to a certain potential or a conducting wall. In addition, the field-compensated measurement carried out by this means is very accurate. The sign of the signal indicates the relative position of the dielectric object, enabling the dielectric object to be located more easily. A change in sign (zero transition) indicates the center of the beam. The effect of tilting can be minimized as in the design described above.

A screening electrode, which is connected to a potential which lies centrally between the alternating voltages, can be arranged on a side of at least one of the capacitance devices which faces away from the dielectric object. This screening electrode can also be a further board or display, for example, and therefore may not be immediately recognizable as a screening electrode. In general, this potential will be ground. A user of the measuring device is therefore shielded from the measuring device, thus enabling interference with the measurement to be minimized.

One of the capacitance devices can be designed in such a way that the capacitance which exists between this capacitance device and the potential probe is independent of the dielectric object. By this means, the measurement can be carried out on the basis of just one capacitance which is dependent on the dielectric object, as a result of which the design of the measuring device can be simplified. In particular, such a measuring device can be insensitive to tilting, as the potential probe can assume the same potential as the electrode, so that the resulting electric field does not change due to the electric field of the potential probe.

A compensation network for changing at least one of the capacitances provided by the capacitance devices by an amount which is independent of the dielectric object can be provided. As a result, a sensitivity of the measuring device can be adjustable, and capacitances of the capacitance devices can be matched to geometrical circumstances for example.

Further, a multiplicity of electrode pairs of the capacitance devices, which for example are located in pairs on different sides of the potential probe, can be provided, wherein the control device is designed to determine at least one of a magnitude, an extension, a distance and an orientation of the dielectric object based on differences of the alternating voltages when different electrode pairs are supplied with the alternating voltages. A spatial resolution of the measuring device can be increased by miniaturizing the electrodes, in one embodiment up to an imaging range. Preferably, the electrodes of the electrode pairs are arranged in the form of a matrix in one plane around the potential probe.

A method for detecting a dielectric object comprises steps which include the determination of an electrical potential in an electric field by means of a potential probe, the supply of two capacitance devices with alternating voltages which are amplified in opposite directions in such a way that the magnitude of an alternating voltage component, which is clock-synchronous with the alternating voltages, of the determined electrical potential is minimized, and the detection of the dielectric object when the alternating voltages are of unequal magnitude.

The method can run on a program-controlled processing device, for example a microcomputer or microcontroller, or be stored on a computer-readable storage medium.

BRIEF DESCRIPTION OF THE DRAWINGS

The disclosure is described in more detail below with reference to the attached figures, in which.

DETAILED DESCRIPTION

Figure 1:
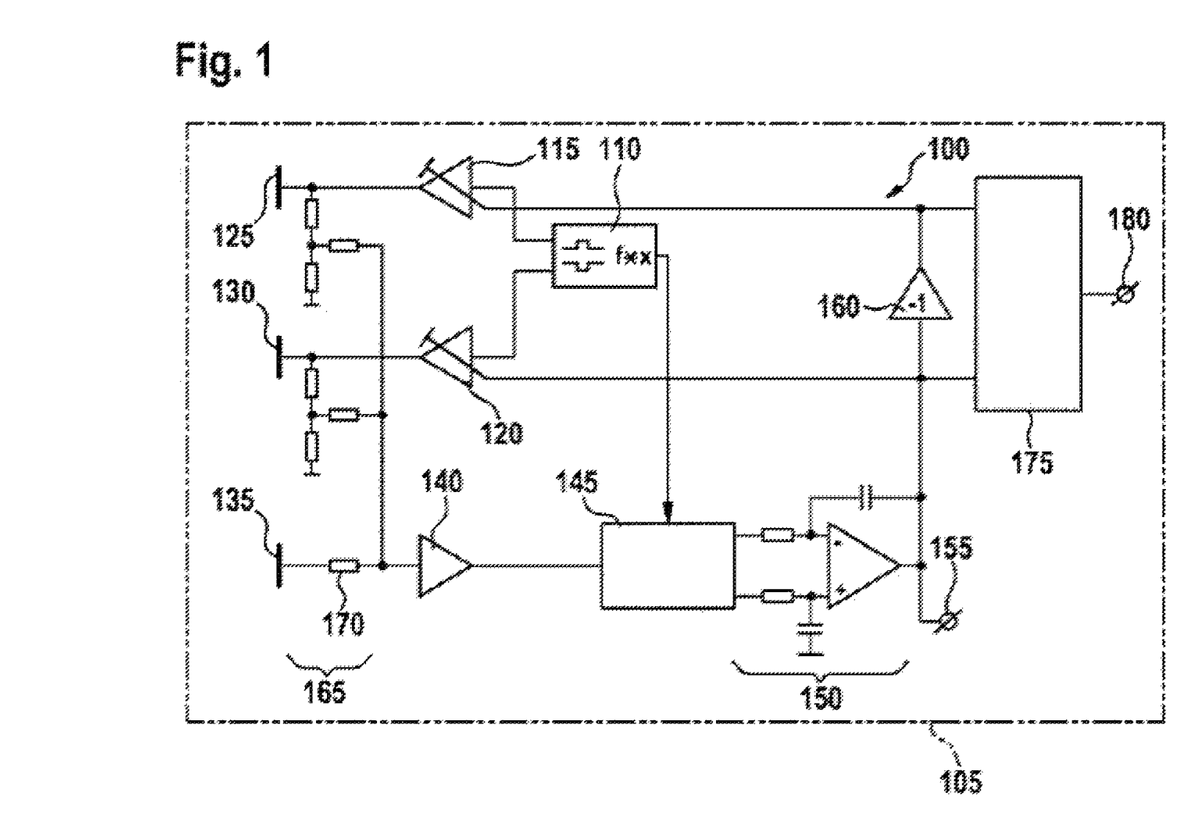
FIG. 1 shows a block circuit diagram of a measuring device.

FIG. 1 shows a block circuit diagram of a measuring device 100. The measuring device 100 is part of a beam locator 105 for detecting dielectric objects, for example made of wood.

A clock generator 110 has two outputs, at which it provides phase-shifted, preferably phase-shifted by 180°, periodic alternating signals. In particular, the alternating signals can be rectangular, triangular or sinusoidal signals. The outputs of the clock generator are connected to a first controllable amplifier 115 and a second controllable amplifier 120 respectively. Each of the controllable amplifiers 115, 120 has a control input, by means of which it receives a signal which controls a gain factor of the controllable amplifier 115, 120. An output of the first controllable amplifier 115 is connected to a first transmitting electrode 125, and an output of the second controllable amplifier 120 is connected to a second transmitting electrode 130.

A receiving electrode 135 serves as a potential probe and is connected to an input amplifier 140; a compensation network 165 shown in the region of the electrodes 125-135 is not considered at this stage and an impedance 170 is omitted. The input amplifier 140 is shown with a constant gain factor; in other embodiments, however, a gain factor of the input amplifier 140 can also be controllable. As a result, a spatial resolution and/or sensitivity of the measuring device 100, for example, can be influenced and controlled as a function of a measured variable for example.

The output of the input amplifier 140 is connected to a synchronous demodulator 145. Furthermore, the synchronous demodulator 145 is connected to the clock generator 110, from which it receives a clock signal which indicates the phase relationship of the signals provided at the outputs of the clock generator 110. In a simple embodiment, in which the signals provided by the clock generator 110 are symmetrical rectangular signals, one of the output signals can be used as a clock signal. The synchronous demodulator 145 essentially switches the measured signal received from the input amplifier 140 alternately to its upper or lower output based on the clock signal provided by the clock generator 110.

The two outputs of the synchronous demodulator 145 are connected to an integrator (integrating comparator) 150 which is shown here by an operational amplifier wired with two resistors and two capacitors. Other embodiments are also possible, for example in the form of active low-pass filters. A digital configuration following the synchronous demodulator 145, in which the signal at the outputs of the synchronous demodulator 145 is converted from analog to digital at one or more points in time within a half wave and then compared with the corresponding value from the next half wave, is also conceivable. The difference is integrated and, for example, reconverted to an analog signal and used to control the amplifier. While the synchronous demodulator 145 provides the measured signal received from the input amplifier 140 at the lower of its outputs, the integrator 150 integrates this signal with respect to time and makes the result available at its output. While the synchronous demodulator 145 provides the measured signal received from the input amplifier 140 at its upper output, this is inverted and integrated by the integrator 150 with respect to time and the result made available at the output of the integrator 150. The voltage at the output of the integrator is the integral of the difference of the low-pass-filtered outputs of the synchronous demodulator.

If the capacitance of the first transmitting electrode 125 is exactly the same as the capacitance of the second transmitting electrode 130, then the mean value with respect to time of the signals provided at the outputs of the synchronous demodulator 145 is the same and a signal which tends to zero (ground) is provided at the output of the integrator 150. If, however, the capacitances are unequal, possibly because a dielectric object is arranged in the region of one of the transmitting electrodes 125, 130, then the mean values of the signals provided at the outputs of the synchronous demodulator 145 are no longer equal and a positive or negative signal is provided at the output of the integrator 150.

The signal provided by the integrator 150 is made available for further processing via a terminal 155. In addition, a microcomputer 165 is connected to the control inputs of the controllable amplifiers 115, 120. The microcomputer 165 carries out a comparison of the provided signal with a threshold value and outputs a signal at an output 170 which indicates the dielectric object. The signal can be presented to a user of the beam detector 105 in optical and/or acoustic form.

In addition, the microcomputer 165 can carry out a further processing of the signals taken from the control inputs of the controllable amplifiers 115, 120, and can control parameters of the measuring device 100 as a function thereof. For example, a frequency or signal form of the alternating voltages at the outputs of the clock generator 110 can be varied, or a sensitivity of the receiving amplifier 140 can be changed. In a further embodiment, further elements of the measuring device 100 shown are implemented by the microcomputer 165, for example the clock generator 110, the synchronous demodulator 145 or the integrator 150.

The same signal of the integrator 150 is also used for controlling the gain factors of the controllable amplifiers 115 and 120, wherein the second controllable amplifier 120 is connected directly to the output of the integrator 150, and the first controllable amplifier 115 is connected to the output of the integrator 150 by means of an inverter 160. The inverter 160 effects a reversal of the signal provided thereto in such a way that, depending on the output signal of the integrator 150, the gain factor of the first controllable amplifier 115 increases to the same extent as the gain factor of the second controllable amplifier 120 decreases and vice versa. It is also conceivable that only the gain factor of one of the controllable amplifiers is controlled, while the gain factor of the second controllable amplifier is kept at a fixed value.

The compensation network 165 comprises a voltage divider consisting of two impedances at each of the transmitting electrodes 125, 130. The divided voltages are fed to the input amplifier 140 by means of a further impedance in each case. The receiving electrode 135 is not fed directly to the input amplifier 140 but by means of the impedance 170. The effective impedances at the outputs of the controllable amplifiers 115, 120 can be varied by appropriate choice of the individual impedances mentioned. As an example, this enables an asymmetrical arrangement of the electrodes 125-135 to be compensated for.

In a further embodiment, in contrast with the diagram of the compensation network 165 in FIG. 1, the impedances in the region of the first transmitting electrode 125 and also the second transmitting electrode 130 are omitted. The alternating voltages of the controllable amplifiers 115, 120 are therefore balanced out between a capacitance connected to the first (only) transmitting electrode 125 and a reference capacitance formed by the compensation network 165. The reference capacitance is invariant compared with a dielectric object. Only the first transmitting electrode 125 and the receiving electrode 135 are required for the measurement.

A reverse embodiment, in which, in contrast with the diagram of the compensation network 165 in FIG. 1, the impedances in the region of the second transmitting electrode 130 and also the first transmitting electrode 125 are omitted, is also possible.

By providing switches, the measuring device 100 can be operated in accordance with the described embodiments in a three-electrode measuring mode using both transmitting electrodes 125 and 130, a first two-electrode measuring mode using the first transmitting electrode 125 and the receiving electrode 135, and a second two-electrode measuring mode using the second transmitting electrode 130 and the receiving electrode 135. Switching between the different measuring modes can take place cyclically or be controlled by a user.

While, in the two-electrode measuring mode, a voltage applied to the terminal 155 of the measuring device 100 in FIG. 1 is greatest when the dielectric object is closest to the receiving electrode 135, in the three-electrode measuring mode, the magnitude of this voltage is maximum when the dielectric object is closest to one of the transmitting electrodes 125 or 130, wherein the sign of the voltage indicates the nearest transmitting electrode in each case. If the object is moved past the electrodes, in the three-electrode measuring mode, this results in a signal with a sign change and, in the two-electrode measuring mode, a signal with a local maximum at the moment of passing.

Figure 2A:
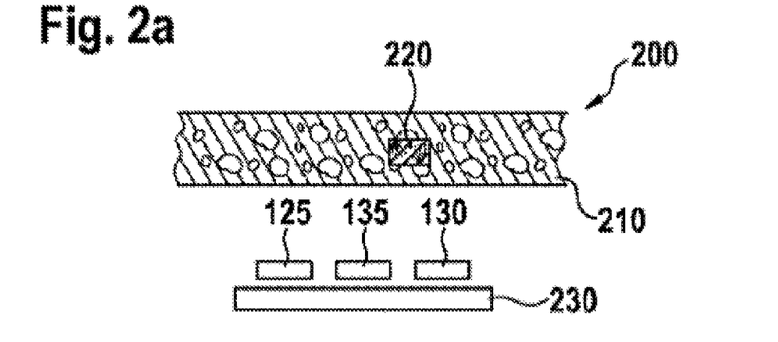
FIGS. 2*a*-2*c* show different arrangements of electrodes for the measuring device from FIG. 1.
Figure 2B:
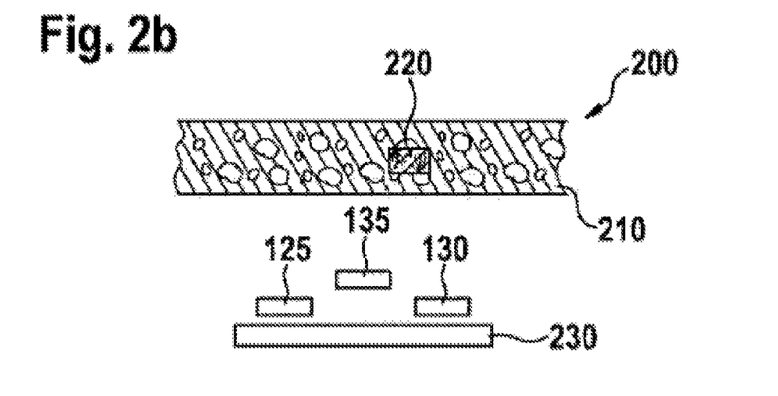
Figure 2C:
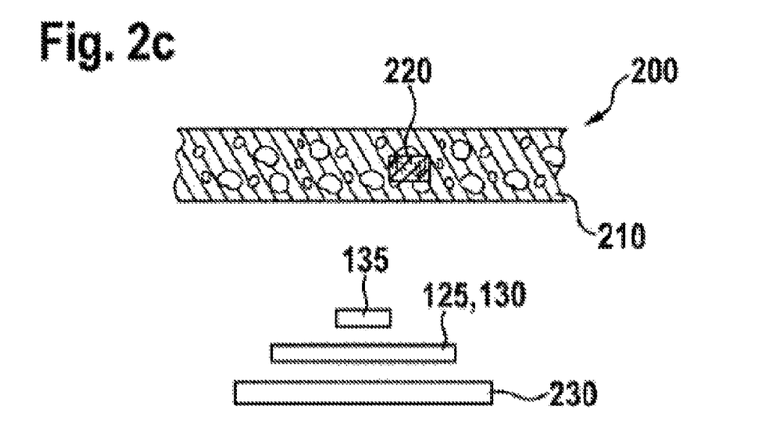

FIGS. 2a-2c show different arrangements 200 of the transmitting electrodes 125, 130 and the receiving electrode 135 from FIG. 1. The viewing direction is towards the floor. A plan view on a horizontal section through a wall 210 is shown in the top part of FIGS. 2a-2c in each case. Wooden beams 220 are concealed in the wall 210. The arrangements 200 shown, in particular those in FIGS. 2b and 2c, can be used universally for capacitive beam locators with a plurality of electrodes and are not restricted to use with the beam locator 105 from FIG. 1.

In FIG. 2a, the electrodes 125, 130, 135 are arranged next to one another in one plane; the distances of the receiving electrode 135 from each of the transmitting electrodes 125, 130 are the same. To screen against influences which come from a different direction from the direction of the wall 210, a screening electrode 230, which is arranged below the electrodes 125, 130, 135, can be provided as an option.

In FIG. 2b, unlike the diagram in FIG. 2a, the receiving electrode 135 is arranged outside the plane in which the transmitting electrodes 125, 130 lie. In the diagram, the receiving electrode 135 is shown above the plane; in an alternative embodiment it can also lie below the plane. If the measuring device 100 with the electrodes 125, 130, 135 and optionally the screening electrode 230 is tilted about a vertical axis parallel to the wall 210, the relative field change at the position of the receiving electrode 135 is less than with the arrangement 200 in FIG. 2a, as the field strengths of the electric fields generated by means of the transmitting electrodes 125, 130 become smaller as the distance increases. The reduced effect of tilting also results from the fact that the distance of the receiving electrode 135 from the wall 210 increases to a smaller extent during tilting than the distance of the transmitting electrodes 125, 130 as a whole from the wall 210.

FIG. 2c shows an arrangement 200 which is suitable for the two-electrode measuring modes described above with reference to FIG. 1. The receiving electrode 135 is arranged above one of the transmitting electrodes 125 or 130, wherein the transmitting electrode 125 or 130 is wider than the receiving electrode 135. The optional screening electrode 230 is preferably even wider than the transmitting electrode 125 or 130. The transmitting electrode can also be formed by electrically connecting two discrete transmitting electrodes 125 and 130. By means of the described arrangement 200, the influence of tilting in the two-electrode measuring mode can be further reduced.

Figure 3A:
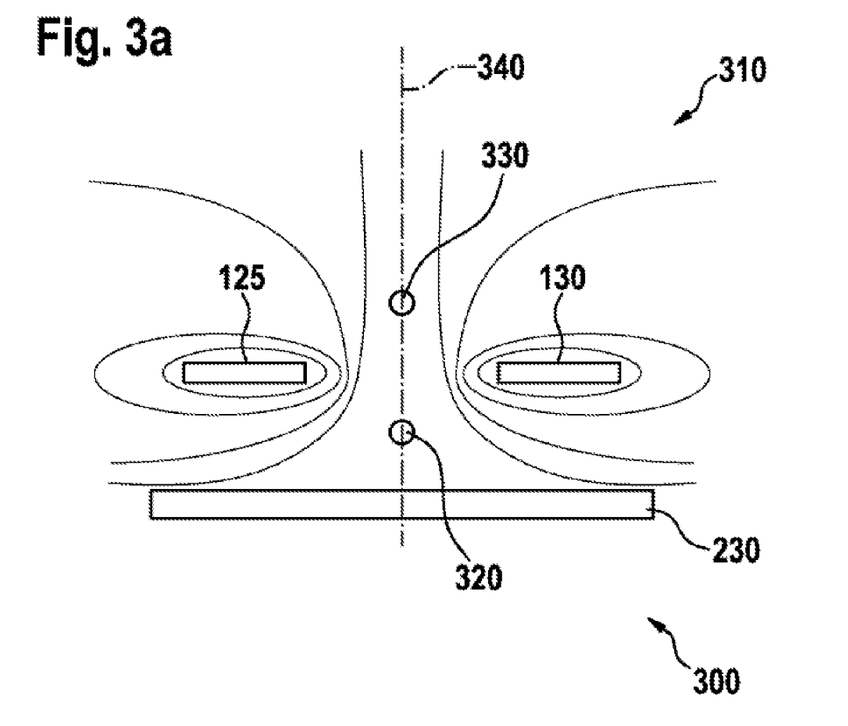
FIGS. 3*a*, 3*b* show a potential probe for the measuring device from FIG. 1.
Figure 3B:
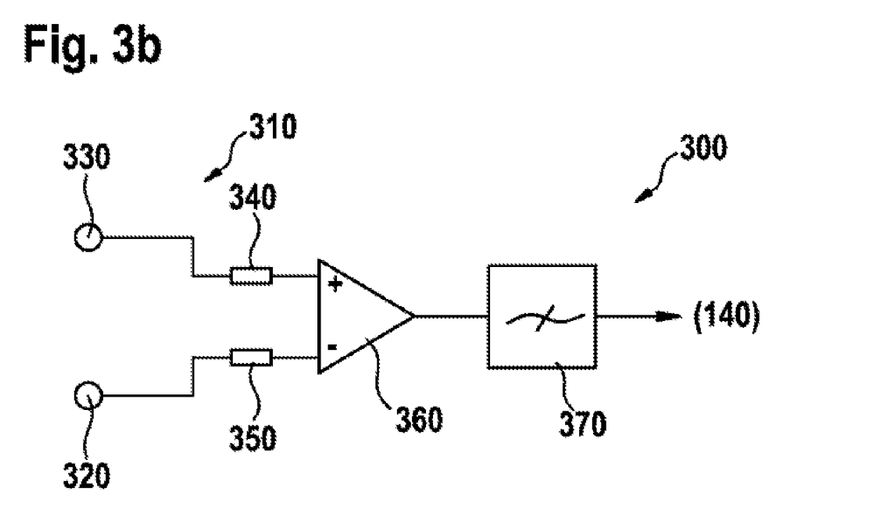

FIGS. 3a and 3b show a potential probe 300 for the measuring device from FIG. 1. An arrangement 310 of electrodes of the potential probe 300 is shown in FIG. 3a, and a circuit of the arrangement 310 with further elements of the potential probe 300 is shown in FIG. 3b. The potential probe 300 can replace the receiving electrode 135 of the measuring device 100 in FIGS. 1 and 2a-2c.

The diagram in FIG. 3a corresponds to the viewing direction in FIGS. 2a-2c. The transmitting electrodes 125 and 130 are arranged in one plane above the screening electrode 230. A first receiving electrode 320 and a second receiving electrode 330 are arranged on a vertical line of symmetry 340 which lies between the transmitting electrodes 125 and 130. The distances of the receiving electrodes 320, 330 from the plane of the transmitting electrodes 125, 130 are preferably equal. Lines of equal electrical potential are shown in the region of the transmitting electrodes 125, 130. The receiving electrodes 320, 330 lie on the zero potential line; however, it is already sufficient if the receiving electrodes 320, 330 lie on the same potential line. A field-compensated measurement can be carried out by means of the measuring device 100 in the arrangement shown of the receiving electrodes 320, 330 on the line of symmetry 340.

As shown in FIG. 3b, the receiving electrodes 320, 330 are connected to inputs of a differential amplifier 360 by means of resistors 340 and 350 respectively. The differential amplifier 360 forms a difference of the voltages applied to its inputs (differential measurement). The output of the differential amplifier 360 leads via a high-pass filter 370 to the input amplifier 140 in FIG. 1 or to the impedance 170 connected before the input amplifier 140 respectively. The high-pass filter 370 removes low-frequency interference which can be caused, for example, by a wall connected to a certain potential or a conducting wall 210.

A dielectric object 220 mainly affects the first receiving electrode 330 so that the second receiving electrode 320 serves as a reference potential. The screening electrode 230 is connected to a zero potential (ground). The screening electrode 230 can also be connected to any other potential, as equal components in the fed-in signals are cancelled out due to the subtraction which takes place in the differential amplifier 360. The potential probe 300 itself is therefore potential-free. In addition, the potential probe shown is insensitive to tilting on account of the electrodes 125, 130, 230, 330, 340 being distributed between a total of three planes, as explained above with reference to FIGS. 2 a-2 c.

The output signal of the potential probe 300 depends on a lateral position of a dielectric object such as the beam 220 from FIGS. 2a-2c. If the beam 220 is moved from right to left past the potential probe 300, then an output signal applied to the terminal 155 of the measuring device 100 in FIG. 1 is negative as long as the beam 220 lies to the left of the axis of symmetry 340, and positive as soon as the beam 220 lies to the right of the axis of symmetry 340. An edge of a large beam 220 can therefore easily be located based on extremes of the output signal by moving the arrangement 310 on the wall 220. Likewise, the center of a beam 220 can easily be located based on a change in sign by moving the arrangement 310 on the wall 220.

Figure 4:
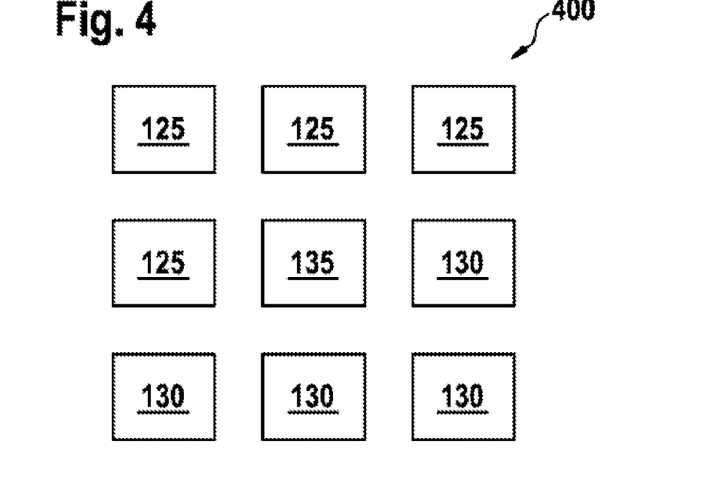
FIG. 4 shows a further arrangement of electrodes for the measuring device from FIG. 1.

FIG. 4 shows a further arrangement 400 of electrodes for use with the measuring device 100 from FIG. 1. The arrangement 400 is shown in plan view. First transmitting electrodes 125 and second transmitting electrodes 130 lie opposite one another in pairs with respect to a receiving electrode 135. The overall structure has the form of a 3×3 matrix, wherein the central element is formed by the receiving electrode 135.

Different pairs of mutually opposing transmitting electrodes 125, 130 can be successively connected to the measuring device 100 from FIG. 1 in the three-electrode measuring mode. Since, in the three-electrode measuring mode, a polarity of the output signal of the measuring device at the terminal 155 depends on a lateral orientation of the dielectric object with respect to the receiving electrode, the orientation of the dielectric object can be accurately determined by the plurality of successive measurements.

In a further embodiment, the electrodes 125, 130 can lie on the diagonals of the arrangement 400, so that the receiving electrodes 135 are arranged in the form of a plus sign (not shown). As described above with reference to FIG. 2, the arrangement 400 can be used in conjunction with a screening electrode 230 on a side of the electrodes 125, 130 which faces away from the dielectric object.

Figure 5:
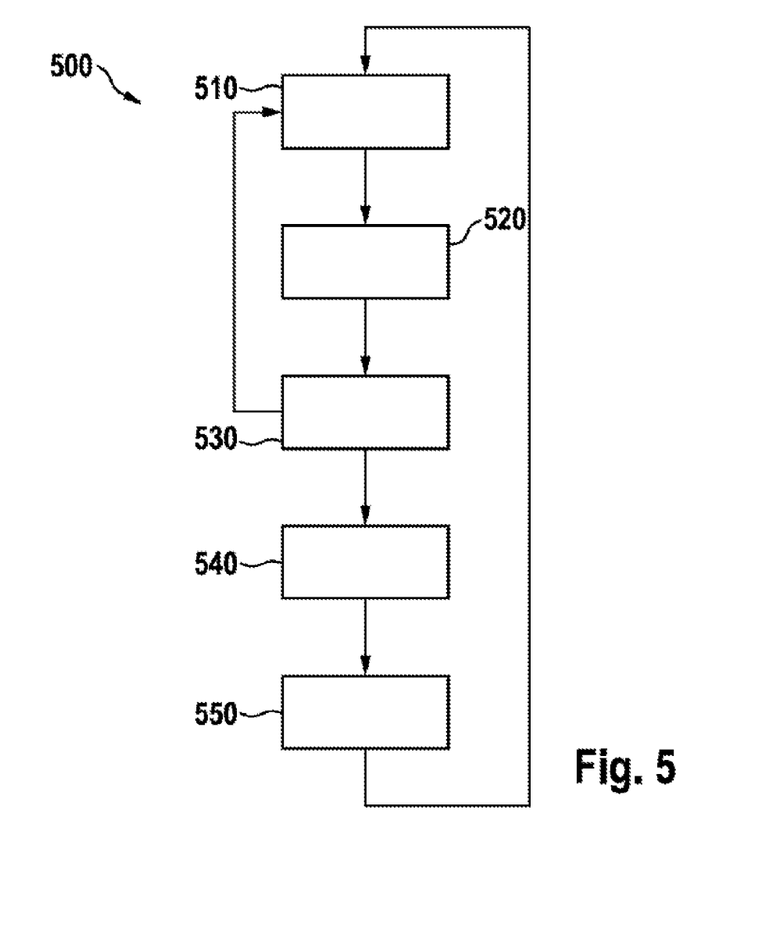
FIG. 5 shows a flow diagram of a method for detecting a dielectric object.

FIG. 5 shows a flow diagram of a method 500 for detecting the dielectric object 220 by means of the device of FIG. 1. The method 500 comprises steps 510 to 550.

In step 510, the capacitance devices 125 and 130 are supplied with alternating voltages. In step 520, an electrical potential, which is established at the potential probe 135, 300 in the region of the capacitance devices 125 and 130, is determined. In step 530, an alternating voltage component of the electrical potential, which is clock-synchronous with the alternating voltages at the capacitance devices 125 and 130, is determined. The supply to the capacitance devices 125 and 130 in step 510 is controlled as a function of the determined alternating voltage component, wherein it may be necessary for the method 500 to run through again for this purpose. The magnitude of the alternating voltage component of the electrical potential determined at the potential probe 135, 300, which is clock-synchronous with the alternating voltages, is minimized by controlling the supply of the capacitance devices 125 and 130. Subsequently, the alternating voltages of the capacitance devices 125 and 130 are compared with one another in step 540. If the voltages deviate from one another by more than a predetermined amount, then the dielectric object 220 is detected in step 550. The method 500 then returns to the beginning and runs through again.

The invention claimed is:

1. A measuring device for detecting a dielectric object, comprising:
   a potential probe configured to determine an electrical potential in an electric field;
   a first capacitance device;
   a second capacitance device;
   a control device configured to supply the first capacitance device and the second capacitance device with alternating voltages,
   wherein the control device is configured to amplify the alternating voltages in opposite directions to one another in order to minimize the magnitude of an alternating voltage component, which is clock-synchronous with the alternating voltages, of a voltage which is recorded by means of the potential probe, and
   wherein the control device is further configured to detect the dielectric object when a ratio of the alternating voltages does not correspond to a ratio of (i) a first distance of the potential probe from the first capacitance device to (ii) a second distance of the potential probe from the second capacitance device.

2. The measuring device as claimed in claim 1, further comprising:
   a screening electrode, which is connected to a potential which lies centrally between the alternating voltages, arranged on a side of at least one of the first capacitance device and the second capacitance device, which faces away from the dielectric object.

3. The measuring device as claimed in claim 1, wherein one of the first capacitance device and the second capacitance device is configured in such a way that the capacitance which exists between the one of the first capacitance device and the second capacitance device and the potential probe is independent of the dielectric object.

4. The measuring device as claimed in claim 1, further comprising:
   a compensation network configured to change at least one of the capacitances provided by the first capacitance device and the second capacitance device by an amount which is independent of the dielectric object.

5. The measuring device as claimed in claim 1, wherein each of the first capacitance device and the second capacitance device includes an electrode which forms a capacitance together with an electrode of the potential probe.

6. The measuring device as claimed in claim 5, wherein the electrodes of the first capacitance device and the second capacitance device are arranged substantially in one plane and the electrode of the potential probe is arranged outside this plane.

7. The measuring device as claimed in claim 6, wherein:
the potential probe comprises two receiving electrodes connected to a differential amplifier, and
the receiving electrodes are arranged on different sides of the plane with equal distances from the first capacitance device and the second capacitance device.

8. The measuring device as claimed in claim 5, further comprising:
a multiplicity of electrode pairs of the first capacitance device and the second capacitance device, which are located in pairs on different sides of the potential probe,
wherein the control device is configured to determine at least one of a magnitude, an extension, a distance and an orientation of the dielectric object based on differences of the alternating voltages when different electrode pairs are supplied with the alternating voltages.

9. The measuring device as claimed in claim 8, wherein the electrodes of the electrode pairs are arranged in the form of a matrix in one plane around the potential probe.

10. A method for detecting a dielectric object comprising:
determining an electrical potential in an electric field by means of a potential probe;
supplying a first capacitance device and a second capacitance device with alternating voltages which are amplified in opposite directions in such a way that the magnitude of an alternating voltage component, which is clock-synchronous with the alternating voltages, of the determined electrical potential is minimized; and
detecting the dielectric object when a ratio of the alternating voltages does not correspond to a ratio of (i) a first distance of the potential probe from the first capacitance device to (ii) a second distance of the potential probe from the second capacitance device.

11. A non-transitory computer-readable storage medium comprising:
programmed instructions configured to be executed by a processing device and to cause the processing device to perform a method of
detecting a dielectric object,
wherein the method includes
(i) determining an electrical potential in an electric field by means of a potential probe,
(ii) supplying a first capacitance device and a second capacitance device with alternating voltages which are amplified in opposite directions in such a way that the magnitude of an alternating voltage component, which is clock-synchronous with the alternating voltages, of the determined electrical potential is minimized, and
(iii) detecting the dielectric object when a ratio of the alternating voltages does not correspond to a ratio of a first distance of the potential probe from the first capacitance device to a second distance of the potential probe from the second capacitance device.

* * * * *